United States Patent
D'Amico et al.

(10) Patent No.: US 7,026,856 B2
(45) Date of Patent: Apr. 11, 2006

(54) CONTINUOUS-TIME FILTER

(75) Inventors: Stefano D'Amico, Corsano (IT); Andrea Baschirotto, Tortona (IT); Alberto Gola, Montu' Beccaria (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/871,438

(22) Filed: Jun. 17, 2004

(65) Prior Publication Data

US 2004/0257153 A1 Dec. 23, 2004

(30) Foreign Application Priority Data

Jun. 20, 2003 (IT) .......................... MI2003A1248

(51) Int. Cl.
*H03K 5/00* (2006.01)
(52) U.S. Cl. ....................................... 327/352; 327/558
(58) Field of Classification Search ........ 327/551–559, 327/311; 330/106, 107
See application file for complete search history.

(56) References Cited

U.S. PATENT DOCUMENTS

| | | | | |
|---|---|---|---|---|
| 5,278,700 A | * | 1/1994 | Sutliff et al. | 360/46 |
| 5,929,699 A | * | 7/1999 | Lewicki | 327/552 |
| 6,011,418 A | * | 1/2000 | Siniscalchi | 327/308 |
| 6,107,870 A | * | 8/2000 | Kawano | 327/553 |
| 6,140,867 A | * | 10/2000 | de Micheli et al. | 327/553 |
| 6,172,569 B1 | * | 1/2001 | McCall et al. | 330/303 |
| 6,310,512 B1 | * | 10/2001 | Briskin et al. | 327/552 |
| 6,838,929 B1 | * | 1/2005 | Mitteregger | 327/553 |

* cited by examiner

*Primary Examiner*—Dinh T. Le
(74) *Attorney, Agent, or Firm*—Lisa K. Jorgenson; Jon A. Gibbons; Fleit, Kain, Gibbons, Gutman, Bongini & Bianco P.L.

(57) ABSTRACT

A continuous-time filter comprising at least one amplifier and at least one passive element. The amplifier comprises at least one input terminal and at least one output terminal and the passive element is positioned between the terminals. In addition the amplifier is provided with a transconductance gain. The filter comprises circuit means suitable for correlating the transconductance gain of the amplifier with the passive element.

10 Claims, 4 Drawing Sheets

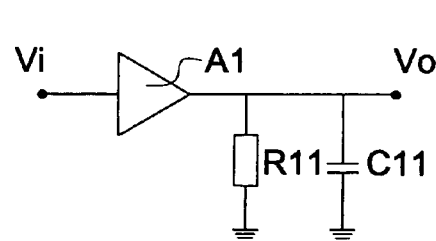
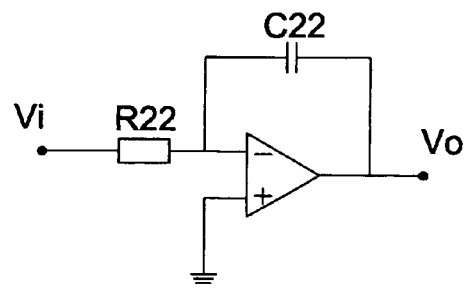
Fig.1  Fig.2
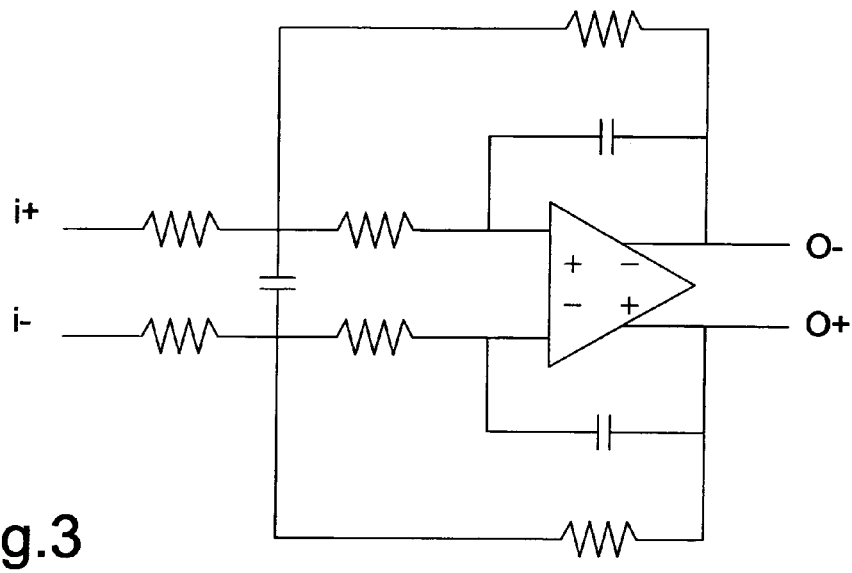
Fig.3
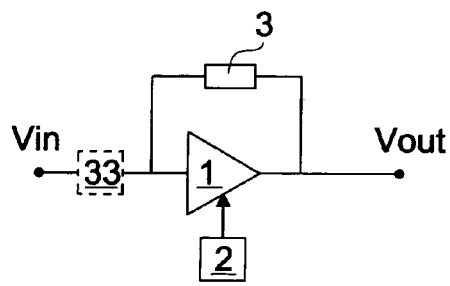
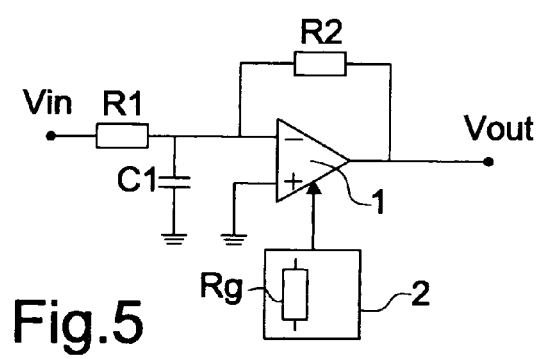
Fig.4  Fig.5

CONTINUOUS-TIME FILTER

CROSS-REFERENCE TO RELATED APPLICATIONS

This application is based upon and claims priority from prior Italian Patent Application No. MI2003A001248, filed on Jun. 20, 2003 the entire disclosure of which is herein incorporated by reference.

FIELD OF THE INVENTION

The present invention generally relates to continuous-time filter and more particularly to active continuous-time filters for high frequency integrated circuits.

BACKGROUND OF THE INVENTION

Continuous-time filters currently constitute subject matter of high interest because of the increase of high frequency integrated systems. In order to produce an active first-order continuous-time filter two approaches are generally used: a first open loop circuit structure (shown in FIG. 1) with a transconductance amplifier A1 and a capacitor C11 in parallel with a resistance R11 and a second closed loop circuit structure (shown in FIG. 2) with an amplifier A2 and a grid formed by a resistance R22 and a capacitor C22. The first circuit structure is also called Gm-C active filter while the second circuit structure is called R-C active filter.

The first circuit structure has the advantages of high velocity and low consumption but has the problems of a limited dynamic range, low linearity and it is sensitive to the parasitic capacitances both in input and in output.

The second circuit structure has the advantages of excellent linearity and good insensitivity to the parasitic capacitances but has the disadvantage of a considerably reduced frequency response in comparison to the first circuit structure.

A second-order continuous-time filter is shown in FIG. 3. The filter has a differential structure having a differential input i+, i− and a differential output O+, O−. The filter comprises only one operational amplifier of the ideal type whose unitary-gain frequency is very high. The arrangement of the circuit elements, resistances and capacitors, is fixed so as to guarantee a very wide frequency band and precision of the response in frequency. Nevertheless the circuit structure presents the disadvantage of having high consumption of energy.

According what is needed is a method and system to overcome the shortcomings and problems encountered in the prior art and to provide a continuous-time filter that has low power dissipation and good linearity

SUMMARY OF THE INVENTION

Briefly, in accordance with the present invention, a continuous-time filter is disclosed. The continuous-time filter comprising at least one amplifier and at least one passive element. The amplifier includes at least one input terminal and at least one output terminal. The passive element is positioned between the input terminal and output terminal. The amplifier being provided with a transconductance gain, characterised in that it comprises circuit means suitable for correlating the transconductance gain of the amplifier with the passive element.

Preferably the amplifier is a single pole amplifier and the unitary-gain frequency of the amplifier is correlated with the passive element of the filter.

Further, the present invention provides a continuous-time filter which although it has a smaller frequency band than known filters, has the same linearity and precision in response in frequency and a lower consumption of power.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention will be apparent from the following detailed description taken in conjunction with the accompanying drawings in which:

FIG. 1 is a circuit diagram of a first structure of a first-order continuous-time filter in accordance with the prior art;

FIG. 2 is a circuit diagram of a second structure of a first-order continuous-time filter in accordance with the prior art;

FIG. 3 is a circuit diagram of a first-order filter in accordance with the prior art;

FIG. 4 is a circuit diagram of a continuous-time filter according to the invention;

FIG. 5 is a circuit diagram of a filter according to first embodiment of the invention;

DESCRIPTION OF THE PREFERRED EMBODIMENTS

Figure 6:
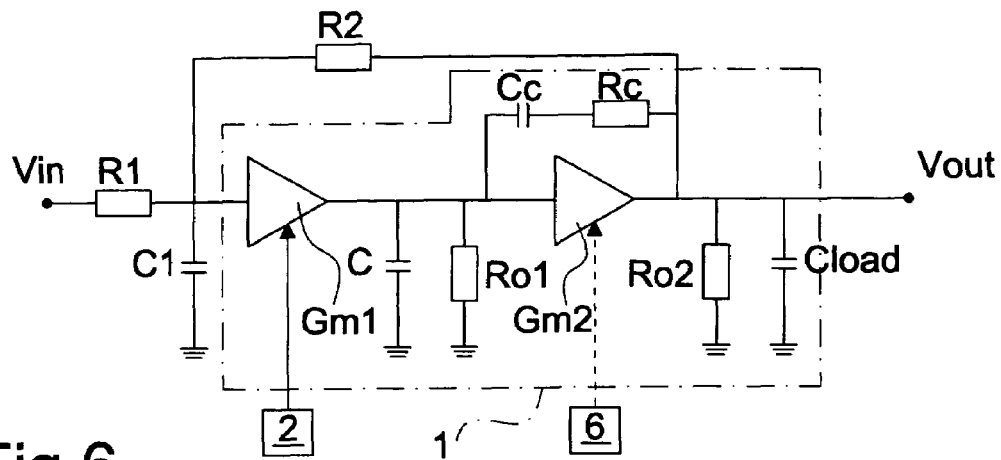
FIG. 6 is a circuit implementation of a filter in accordance with the circuit diagram of FIG. 5.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

With reference to FIG. 4 a circuit diagram of a continuous-time filter according to the invention is shown. The idea at the base of the invention is to produce a continuous-time filter by means of a closed loop type circuit but instead of an operational amplifier (with theoretically infinite band) using an amplifier with smaller band, such as a transconductance amplifier; in this way a two pole filter can be obtained which has an appreciable reduction of the energy dissipated but nevertheless keeping good linearity characteristics similar to the circuit structure of FIG. 3. In fact the filter is provided with an input terminal on which an input signal Vin acts, an output terminal from which the signal Vout given by the filtered signal Vin leaves, an amplifier 1 coupled to the input and output terminals of the filter and being provided with a transconductance gain, at least one passive element 3 positioned between the output and the input of the amplifier 1 and circuit means 2 suitable for correlating the transconductance gain of the amplifier with the at least one passive element. Preferably the amplifier 1 has only one pole and the unitary-gain frequency of the amplifier is correlated with the at least one passive element. If the signal Vin is a voltage signal, a circuit element 33 (in a dotted line in FIG. 4) has to be inserted between the input terminal of the filter on which signal Vin is present and the input of the amplifier 1.

A circuit structure of a filter according to first embodiment of the invention is shown in FIG. 5, that is a circuit structure of a low-pass filter. The circuit structure of FIG. 5 comprises the amplifier 1 having the non-inverting input connected to ground and the inverting input connected to a resistance R1 connected in turn with the input terminal of the filter on which the input voltage Vin is present, a capacitor C1 positioned between the inverting terminal board and ground, and a resistance R2 positioned between the inverting terminal and the output terminal of the filter that coincides with the output terminal of the amplifier 1 on which the output voltage Vout is present. The amplifier 1 has a circuit structure with a single pole transfer function, which can be written as:

$$A(s) = \frac{Adc}{(1+s\tau)} = \frac{\omega * \tau}{(1+s\tau)}$$

where $1/\tau$ and Adc are the angular frequency of the first pole and the gain in direct current of the amplifier. In addition $\omega$ is the angular unitary-gain frequency that is given by $\omega = Adc/\tau$. Considering the entire circuit structure of FIG. 5 the transfer function $T(s)$ is given by:

$$T(s) = \frac{R2 * \omega * \tau}{s^2 * 2(\tau C1R1R2) + s*(2C1R1R2 + R1\tau + R2\tau) + (R1 + R2 + R1\omega\tau)}.$$

If the amplifier is produced like the circuit structure of FIG. 1, the angular frequency $\omega$ is given by $\omega = Gm/C11$ and the gain Adc is given by $Adc = GmR11$.

If the gain $Adc \gg R1C1\omega$ and always $Adc \gg R2C1\omega$ and finally always $Adc \gg 1 + R2/R1$ the transfer function $T(s)$ becomes:

$$T(s) = \frac{\frac{Gm}{2*C1*R1*C11}}{s^2 + \frac{s(R1+R2)}{2*C1*R1*R2} + \frac{Gm}{2*R2*C1*C11}}.$$

The characteristic parameters of this filter are the direct current gain K given by $K = R2/R1$, the frequency of the pole fp given by:

$$fp = \frac{1}{2\pi} \sqrt{\frac{Gm}{2*R2*C1*C11}}$$

and the quality factor Q given by $$Q = \frac{1}{K+1} \sqrt{\frac{2*GmR2C1}{C11}}.$$

Therefore the pole at frequency fp of the filter is in relation with the pole of the amplifier 1. The circuit means 2 permit the correlation of angular unitary-gain frequency $\omega$ with the resistances R1 and R2 so as to make the amplifier 1 like an integrator adjustable at the interest frequency. In fact the circuit means 2 correlate the transconductance gain Gm with a resistance Rg made in the same way in which the resistances R1 and R2 are made; in this way every variation undergone by the resistance Rg, due for example to the temperature or other, is undergone by the resistances R1 and R2 and by the gain Gm and the frequency fp does not change in function of the variations. The circuit structure of the filter according to the invention is more rugged in comparison to the circuit structures of the known filters.

The amplifier 1, in accordance with a variant of the first embodiment of the invention, can be made with an input stage composed of a first transconductance amplifier Gm1 and a resistance Ro1 and with an output stage comprising a second transconductance amplifier Gm2 and a resistance Ro2, as can be seen in FIG. 6. In this case the direct current gain Adc is adc=Gm1Ro1Gm2Ro2. In the circuit structure of the filter of FIG. 6 circuit means 2 are always present.

Assuming that Gm2Ro2$\gg$1 the angular unitary-gain frequency is $\omega = Gm1/C$, therefore the angular frequency does not depend on the gain of the output stage. The circuit structure of FIG. 6 is linear because the majority of the input signal is elaborated by the linear and passive elements and only a small part is elaborated by the input stage of the amplifier which is not linear. In the circuit of FIG. 6 a pole-zero compensation of the second pole of the amplifier is also present by means of the series of the capacitance Cc and of the resistance Rc. A circuit block 6 can also be provided for which is suitable for correlating the transconductance gain Gm2 with the resistance Rc.

Figure 7:
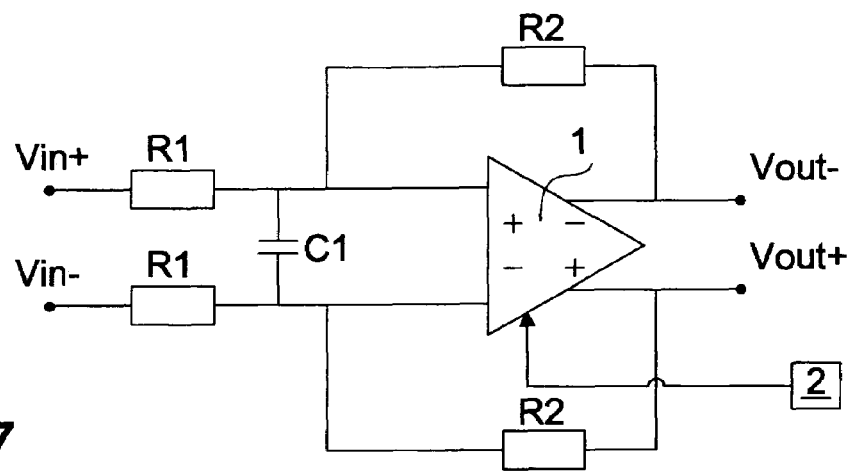
FIG. 7 is a circuit diagram of a continuous-time filter according to a variant to the first embodiment of the invention.

In accordance with a variant of the first embodiment of the invention the continuous-time filter can have differential structure such as that shown in FIG. 7. The filter of FIG. 7 again comprises the amplifier 1 having the inverting and non-inverting terminal boards connected to respective resistances R1 in turn connected to respective input terminals of the filter on which the signals Vin+ and Vin− act; the capacitor C1 is positioned between the inverting and non-inverting terminal boards of the amplifier 1. The output terminals of the filter, which coincide with the output terminals of the amplifier 1 and on which the output signals Vout+ and Vout− act, are connected by means of resistances R2 to the non-inverting and inverting terminal boards of the amplifier 1. The latter can be implemented similarly to the structure shown in FIG. 6 in the case of circuit structure of filter with single input and single output.

The circuit structures of FIGS. 5 and 7 can be implemented in various manners.

Figure 8:
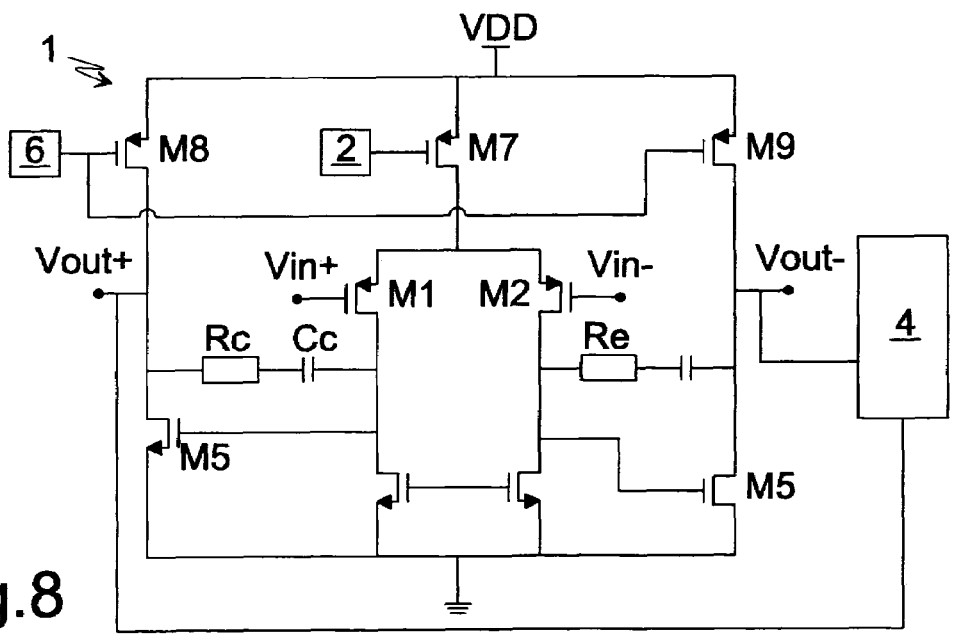
FIG. 8 is a circuit diagram of the amplifier of FIG. 6 in its differential use.

The amplifier 1 as shown in FIG. 6 but in the case of direct current filter with differential structure, that is considering the circuit structure of FIG. 7, can be made for example with the circuit structure in CMOS technology of FIG. 8. In this case the input stage of the amplifier 1 coincides with the differential pair of transistors MOS M1 and M2 while the gain of the second stage is given by the transistor MOS M5.

In addition there is a compensation of the Miller effect by means of the resistance Rc and the capacitance Cc which is designed so as to be equal to the load capacitance Cload. By means of the circuit means 2 whose output acts on the gate terminal of the transistor M7 the transconductance of the transistors M1 and M2 is regulated, representing the gain of the input stage Gm1. The transistor M7 is a PMOS transistor having the source terminal connected to the supply voltage VDD and the drain terminal connected to the source terminals of the transistors M1 and M2. The transistors M8 and M9 are driven by the output signal of the block 6; the transistors have the source terminals connected to the supply voltage VDD and the drain terminal connected to the drain terminals of the transistors M5 and provide for the regulation of the transconductance gain of the transistors M5. Given that the angular unitary-gain frequency depends only on the transconductance gain of the input stage and on the capacitance C, by regulating the transconductance or the capacitance C the response in frequency of the circuit structure is also regulated. The output terminals of the amplifier 1 are connected to a known common mode feedback circuit 4.

The implementation shown in FIG. 8 can produce effects that are not ideal on the frequency response that have to be minimised and that is the presence of parasitic elements (capacitance and resistances) and the influence of the second pole.

Figure 9:
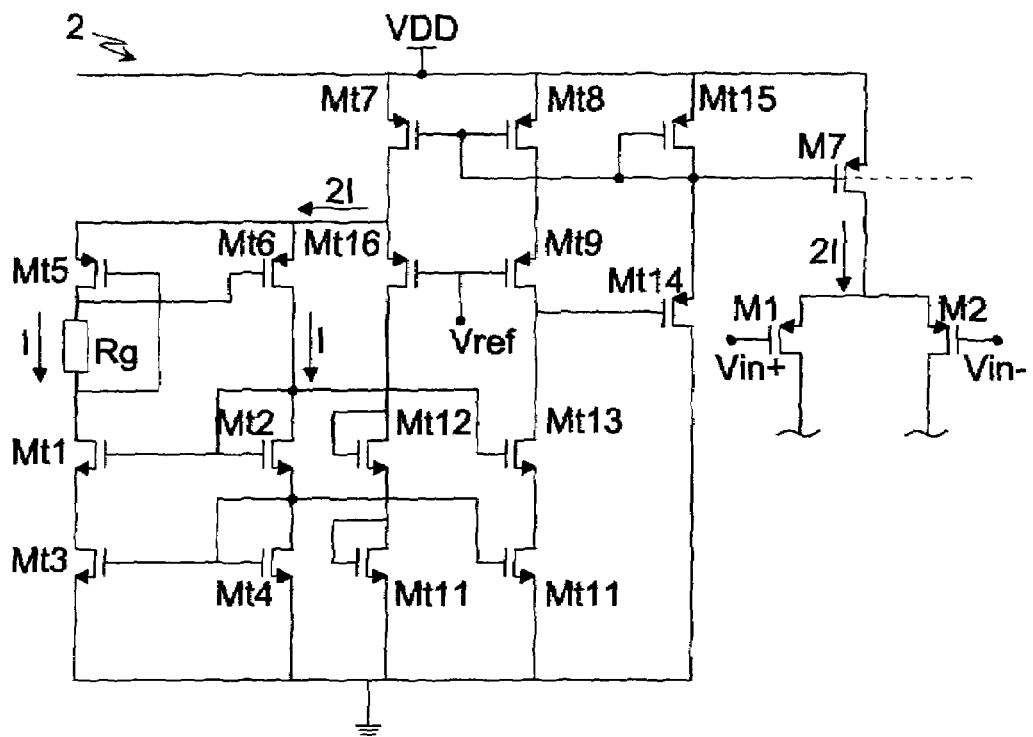
FIG. 9 shows a circuit implementation of the circuit means 2 of FIG. 6.

In order to annul the variations of the transconductance gain due to the temperature or to the manufacturing process circuit means 2 are added to the circuit of FIG. 8, which are suitable for imposing on the transistors M1 and M2 such a current that the transconductance gain Gm1 of the input stage is correlated with the resistance Rg belonging to the circuit means 2; the resistance Rg is made in the same manner as the resistances R1 and R2. An implementation of the means 2 is shown in FIG. 9 where the cascade mirror formed by the transistors Mt1–Mt4 imposes an identical current to flow through transistors Mt5 and Mt6. Between the drain terminal of the transistor Mt5 connected to the gate terminal of the transistor Mt6 and the drain terminal of the transistor Mt1 connected to the gate terminal of the transistor Mt5 a resistance Rg is positioned. Assuming that the transistors Mt5 and Mt6 operate in the range of strong inversion and saturation we obtain:

$$Im\ t5 = \frac{K'}{2}\left(\frac{W}{L}\right)(Vsg, t5 + Vth)^2$$

and $$Im\ t6 = 4\frac{K'}{2}\left(\frac{W}{L}\right)(Vsg, t6 + Vth)^2$$

where Imt5 and Imt6 are the currents that flow in the transistors Mt5 and Mt6, Vth is the threshold voltage assumed equal for both the transistors, W/L is the shape factor, K' is a constant depending on the process and Vsg,t5 and Vsg,t6 are the voltages between the source and gate terminals of the transistors Mt5 and Mt6. As Imt5=Imt6=I and Vsg,t5–Vsg,t6=I*Rg, we obtain Vsg,t5+Vth=2*(Vsg,t6+Vth). Therefore we obtain $$\frac{2*I}{Vsg, t5 + Vth} = \frac{1}{Rg}.$$

-continued

Given that $$Gm = \frac{dIsd}{dVsg} = \frac{2*Isd}{(Vsg + Vth)}$$

where Isd is the current that flows between the drain and source terminals of a transistor MOS. Therefore we obtain in the case of the transistor Mt5 that its transconductance gain is Gm,t5=1/Rg independently from the variations of the mobility, the temperature and the threshold voltage. The transistors M1 and M2 of the amplifier of FIG. 6 are correlated with the transistors Mt5 and Mt6. A circuitry made by the transistors Mt7–Mt16 with suitable values of the form factor W/L, provide for a current equal to 2I to flow on the transistor M7; in this manner the transistors M1 and M2 operate in the same conditions as the transistors Mt5 and Mt6 and we can write that the transconductance gain of the transistor M1 is Gm,m1=1/Rg where Gm,m1=Gm1. The above-mentioned circuitry comprises a current mirror formed by the transistors Mt7 and Mt15 having source terminals connected to the supply voltage VDD. The drain terminal of the transistor Mt7 connected to the source terminals of the transistors Mt5 and Mt6 and to the source terminal of a transistor Mt16 having the gate terminal connected to a reference voltage Vref and the drain terminal connected to the drain terminal of a transistor Mt12 connected to a diode; the latter is connected to a transistor Mt1 connected to a diode and connected to ground. The circuitry comprises a transistor Mt8 having the source terminal connected to the voltage VDD, the gate terminal connected to the gate terminal of the transistor Mt7 and the drain terminal connected to the source terminal of a transistor Mt9. The latter has the gate terminal connected to the voltage Vref and the drain terminal connected to the drain terminal of another transistor Mt13 having the gate terminal connected to the gate terminal of the transistor Mt2 and the source terminal connected to the drain terminal of a transistor Mt10. The latter has the gate terminal connected to the gate terminal of the transistor Mt4 and the source terminal connected to ground. A transistor Mt14 has the source terminal connected to ground, the gate terminal connected to the drain terminal of the transistor Mt13 and the drain terminal connected to the drain terminal of the transistor Mt15 and connected to the gate terminal of the transistor M7. The drain terminal of the transistor Mt15 is the output terminal of the circuit means 2.

With the presence of the circuit means 2 the quality factor Q can be expressed in function of the ratio between resistances and capacitance while factor K depends on the ratio of resistances. Therefore both the quality factor Q and factor K only depend on the non-correlation of the passive components that can be reduced to under 1% by means of a suitable layout.

The frequency of the pole depends on the absolute values of the resistances and of the capacitance; therefore a regulation circuit is necessary to adjust the frequency of the pole. If the resistances and the transconductance gains are considered ideal and all the deviations of the time constants are attributed to the capacitances, a known array of capacitances can be used as regulation circuit comprising a fixed capacitance Coff and a series of N capacitances weighted in binary mode and placed in series to switches, for example transistors MOS, controlled by a digital device. The smallest capacitance has a value δC and the maximum total capacitance of the array is Car=Coff+NδC.

Figure 10:
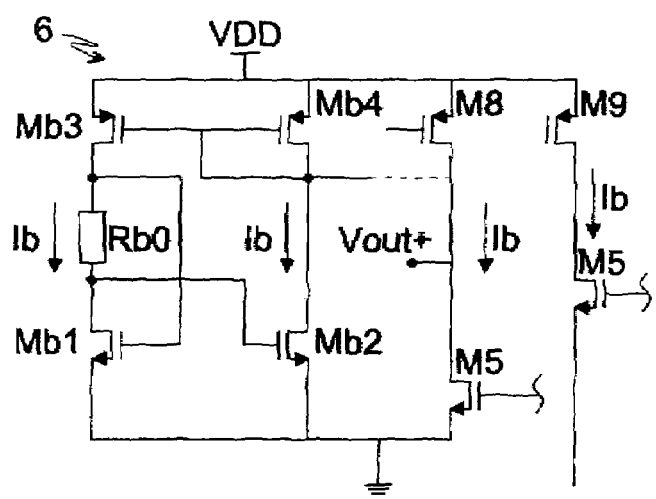
FIG. 10 shows a circuit implementation of the circuit means 6 of FIG. 6.

In the circuit diagram of FIG. 6, by using as amplifier 1 the diagram of the differential circuit amplifier of FIG. 6, the second pole p2 of the response in frequency is given by p2=gm5/Cload where gm5 is the transconductance of the transistor M5 of the output stage, with gm5=Gm2, and Cload is the load capacitance. The use of the resistance Rc and of the capacitance Cc introduces, still in the response in frequency, a zero given by pz=gm5/Cc*(1−Rcgm5). The resistance Rc can be designed to cancel the second pole p2 with the zero pz, placing in this case Rc=2/gm5 being Cc=Cload. Nevertheless the pole-zero cancellation is critical and sensitive to the process tolerances and therefore a block 6 has been designed to correlate the variations of the transconductance gain of the transistors M5 of the output stage with the variations of the compensation resistance Rc. An implementation of the block 6 is shown in FIG. 10 where the mirror formed by the transistors Mb3–Mb4 imposes an identical current to flow through the transistors Mb1 and Mb2. Between the drain terminal of the transistor Mb1, connected to the gate terminal of the transistor Mb2, and the drain terminal of the transistor Mb3 connected to the gate terminal of the transistor Mb1 a resistance Rb0 is positioned. Assuming that the transistors Mb1 and Mb2 operate in the range of strong inversion and saturation we have:

$$Im\ b1 = \frac{K'}{2}\left(\frac{W}{L}\right)(Vsg,b1+Vthb)^2$$

and $$Im\ b2 = 4\frac{K'}{2}\left(\frac{W}{L}\right)(Vsg,b2+Vthb)^2$$

where Imb1 and Imb2 are the currents that flow in the transistors Mb1 and Mb2, Vthb is threshold voltage assumed equal for both the transistors, W/L is the form factor, K' is a constant depending on the process and Vsg,b1 and Vsg,b2 are the voltages between the source and gate terminals of the transistors Mb1 and Mb2. As Imb1=Imb2=Ib and Vsg,b1−Vsg,b2=Ib*Rb0, we obtain Vsg,b1+Vthb=2*(Vsg,b2+Vthb). Therefore we obtain $$\frac{2*Ib}{Vsg,b1+Vthb} = \frac{1}{Rb0}.$$

Given that $$Gm = \frac{dIsd}{dVsg} = \frac{2*Isd}{(Vsg+Vth)}$$

where Isd is the current that flows between the drain and source terminals of a transistor MOS. Therefore we obtain in the case of the transistor Mb1 that its transconductance gain is Gm,b1=1/Rb0 independently from the variations of the mobility, the temperature and the threshold voltage. The transistor M5 of the amplifier of FIG. 8 is correlated with the transistor Mb1 given that the current Ib is carried by means of the transistors M8 and M9 to the transistors M5; it can be written that the transconductance gain of the transistor M5 is Gm5=1/Rb0. The drain terminal of the transistor Mb4 is the output terminal of the block 6.

The circuit block 6 can have the function of the circuit means 2 in the case in which the filter according to the invention has a circuit structure with single input and single output.

The filter according to the invention is linear because the majority of the signal is elaborated by means of linear and passive elements, by way of example the resistances and the capacitance, while smaller part is elaborated by non-linear elements of the amplifier 1. At low frequencies the gain of the amplifier is large and a little signal is present at the input of the amplifier; In this case the contribution to the distortion of the output stage is dominant. As the frequency increases the gain of the amplifier decreases and the amplitude of the signal to the input of the amplifier 1 grows; in this case the greater contribution to the distortion is due to the input stage. When the frequency of the signal exceeds the frequency of the first pole, the output signal decreases with the square root of the frequency. An element to determine the distortion is the factor IIP3, that is the third harmonic intercept referred to the input (Input Intercept Point 3), which at the high frequencies can be calculated as follows:

$$IIP3[dBm] = 10\log_{10}\left(\frac{24\,|A(f)|^3\,(Vov)^2}{|A(3*f)|^3\,|T(f)|^2}\right)+13$$

where A(f) and T(f) are respectively the transfer functions of the filter evaluated at the frequency of the signal in input and Vov is the overdrive voltage of the transistors of the input stage of the filter.

Figure 11:
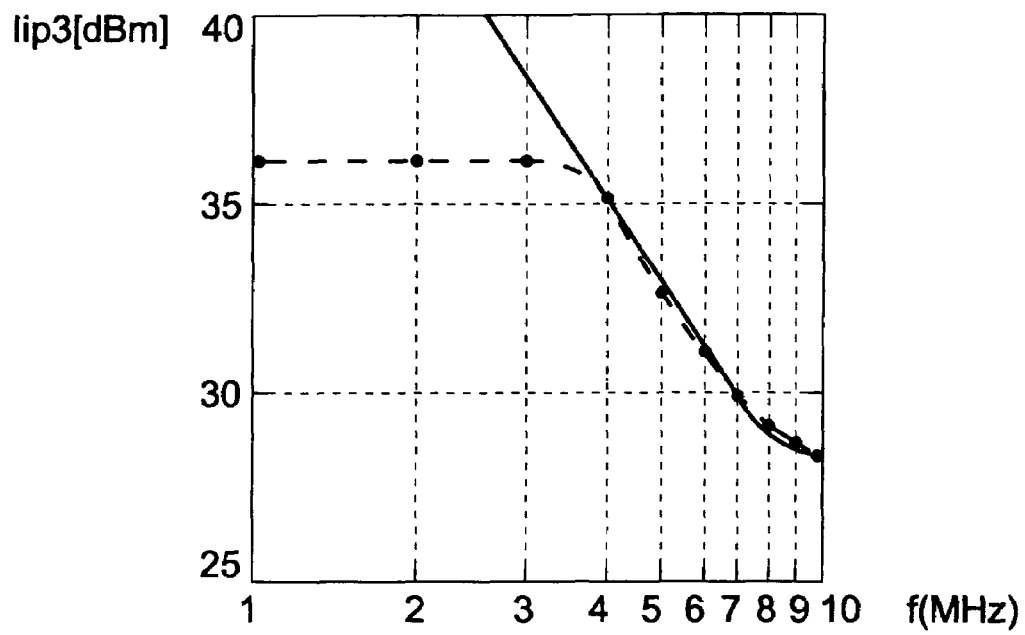
FIG. 11 shows a diagram of the factor IIP3 in function of the frequency of the signal in input to the filter.
Figure 12:
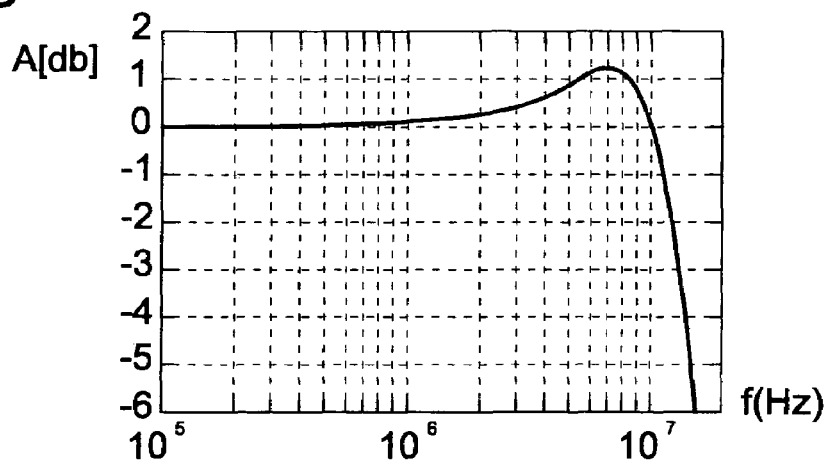
FIG. 12 shows a diagram of the amplitude of the filter of FIG. 6 in function of the frequency.

A filter according to the invention, having a low-pass circuit structure with a frequency of the pole at 10 Mhz and a unitary Q factor, has been designed using a CMOS technology with a minimum channel length of 0.18 μm and a supply voltage of 1.8 V. The parameters of the cell are the following: R1=R2=5kΩ, C1=3.18 pF, Cc=Cload=4 pF, Adc=49 dB, ω/2π=20.054 MHz. The characteristics of the amplifier 1 implemented by the circuit of FIG. 6 are gm1=gm2=504 μA/V, I=100 μA, (W/L)M1=(W/L)M2=8.5 μm/0,3 μm, (W/L)M3=(W/L)M4=36 μm/0.3 μm, gm5=gm6=5.5 mA/V, I5=235 μA, (W/L)M5=(W/L)M6=200 μm/0.24 μm, (W/L)M7=(W/L)M8=440 μm/0.24 μm. The power consumption is due to the power consumption of the amplifier 1 and is equal to 1.2 mW. The angular frequency ω is designed to be twice the frequency of the pole which is a good compromise between power consumption and linearity of the response in frequency. The behaviour in frequency of the filter is shown in FIG. 12 that is the gain A in decibels in function of the frequency in hertz. The third pole of the filter (a 571 Mhz), that coincides with the second pole of the amplifier 1, is positioned at a very high frequency thanks to the pole-zero cancellation; the amplifier behaves in the dominion of the frequency and after the first pole as an integrator. The total harmonic distortion THD is −54dB when a sinusoidal signal at 1 Mhz is applied in input, with a peak-peak voltage of 1.8V. FIG. 11 shows the graph of the factor IIP3 in dBm at the high frequencies of the signal in input; the simulated factor IIP3 is shown in a dotted line while that given by the equation is shown in a continuous line. The factor IIP3 is of 36dBm with a sinusoidal signal at 1 Mhz in input with a peak-peak voltage of 500 mV.

Figure 13:
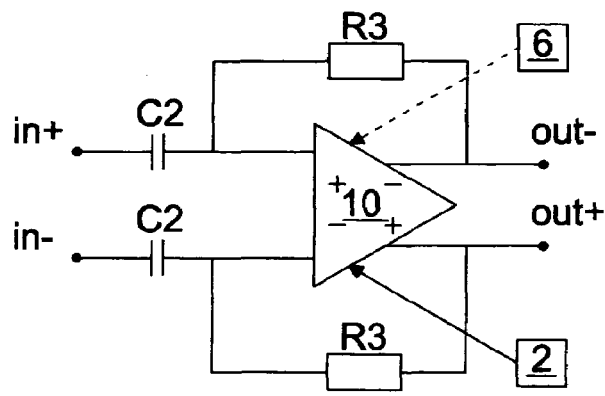
FIG. 13 shows a continuous-time filter according to a second embodiment of the invention.

FIG. 13 shows a circuit structure of a filter according to a second embodiment of the invention, that is a circuit structure of a band-pass filter. The circuit structure of FIG. 13 has differential structure and comprises the amplifier 10 having the non-inverting input connected to a first capacitance C2 and the inverting input connected to a second capacitance C2; both the capacitances C2 are connected in turn with the input terminals in+ and in− of the filter, two resistances R3 positioned one between the inverting terminal and the output terminal out− of the filter and the other between the non-inverting terminal and the output terminal out+ of the filter; the terminals out− and out+coincide with the output terminals of the amplifier 10. The latter has a circuit structure with a single pole transfer function, which can be written as:

$$A(s) = \frac{Adc}{(1+s\tau)} = \frac{\omega * \tau}{(1+s\tau)}$$

where $1/\tau$ and Adc are the angular frequency of the first pole and the gain in direct current of the amplifier. In addition $\omega$ is the angular unitary-gain frequency which is given by $\omega = Adc/\tau$. Considering the entire circuit structure of FIG. 12 the transfer function T(s) is given by:

$$T(s) = \frac{s*\omega*\frac{\tau+R3C2}{\tau*R3*C2} + \frac{1+\omega\tau}{\tau+R3*C2}}{s^2 + s*\frac{\tau+R3C2}{\tau*R3*C2} + \frac{1+\omega\tau}{\tau+R3*C2}}.$$

If the amplifier is made like the circuit structure of FIG. 1, the angular frequency $\omega$ is given by $\omega = Gm/C11$ and the gain Adc is given by $Adc = GmRo1$.

If the gain $Adc \gg R3C2\omega$ and always $Adc \gg 1$ the transfer function T(s) becomes:

$$T(s) = \frac{\frac{Gm}{C11}}{s^2 + \frac{s}{C2*R3} + \frac{Gm}{R3*C3*C11}}.$$

The characteristic parameters of this filter are the maximum gain at direct current $Amax = Gm*R3*C2/C11$, the angular frequency of the pole fp given by $$fp = \frac{1}{2\pi}\sqrt{\frac{Gm}{R3*C2*C11}}$$

and the quality factor Q given by $$Q = \sqrt{\frac{Gm*R3*C2}{C11}}.$$

Therefore the pole fp of the filter is in relation with the pole of the amplifier 1. The circuit means 2 correlate the transconductance gain Gm with a resistance Rg made in the same manner as that in which the resistance R3 is made; in this manner every variation undergone by the resistance Rg, due for example to the temperature or other, is undergone by the resistance R3 and by the gain Gm and the frequency fp does not change in function of the variations. Correlating the gain Gm with the resistance Rg the above-mentioned characteristics parameters of the filter can be expressed in function of the resistance Rg replacing Gm=1/Rg.

Should the amplifier 10 have a second pole and a pole-zero compensation is necessary by means of a capacitance and a resistance of compensation the circuit block 6 can also be inserted to correlate the resistance of compensation with the transconductance gain on which the second pole depends.

The amplifiers 1 and 10 are preferably operational amplifiers.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A continuous-time filter comprising:
   at least one amplifier, wherein the amplifier includes at least one input terminal and at least one output terminal and the amplifier includes a transconductance gain;
   at least one passive element, wherein the passive element is positioned between the input terminal and the output terminal;
   circuit means for correlating the transconductance gain of the amplifier with the passive element; and
   wherein the amplifier further comprises an input stage and an output stage, the input stage having a first transconductance gain and the output stage having a second transconductance gain, and wherein the circuit means correlates the first transconductance gain with the passive element.

2. The continuous-time filter according to claim 1, wherein the amplifier is a single pole amplifier with a unitary-gain frequency correlated with the passive element so to make the amplifier act as an integrator.

3. The continuous-time filter according to claim 1, wherein the circuit means further comprises:
   a first resistance fabricated by an identical manufacturing process as the passive element.

4. The continuous-time filter according to claim 3, wherein the first transconductance gain of input stage is proportional to a current which is correlated with the first resistance to annul variations of the first transconductance gain due to variations in at least one of temperature and manufacturing process.

5. The continuous-time filter according to claim 3, wherein the amplifier further includes a first pole and a second pole, wherein a series combination of a compensation resistance and compensation capacitance provides a pole-zero compensation of the second pole.

6. The continuous-time filter according to claim 5, wherein the circuit means further comprises:
   a second resistance fabricated in the identical manufacturing processes as the compensation resistance of compensation.

7. The continuous-time filter according to claim 6, wherein a second transconductance gain of the output stage is proportional to a current which is correlated with the compensation resistance to annul variations of the second transconductance gain due to variations in at least one of temperature and manufacturing process.

8. The continuous-time filter according to claim 1, wherein the amplifier forms a second-order filter.

9. The continuous-time filter according to claim 1, wherein the amplifier is an operational amplifier.

10. The continuous-time filter according to claim 1, wherein the amplifier forms a filter with a unitary-gain frequency bandwidth substantial comparable to a cut-off frequency of the filter.

* * * * *